(12) United States Patent
Gooding et al.

(10) Patent No.: US 7,480,611 B2
(45) Date of Patent: Jan. 20, 2009

(54) METHOD AND APPARATUS TO INCREASE THE USABLE MEMORY CAPACITY OF A LOGIC SIMULATION HARDWARE EMULATOR/ACCELERATOR

(75) Inventors: Thomas Michael Gooding, Rochester, MN (US); Roy Glenn Musselman, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 946 days.

(21) Appl. No.: 10/845,496

(22) Filed: May 13, 2004

(65) Prior Publication Data
US 2005/0256696 A1 Nov. 17, 2005

(51) Int. Cl.
*G06F 9/455* (2006.01)
(52) U.S. Cl. .................. 703/25; 703/27; 710/2
(58) Field of Classification Search ........... 703/23, 703/27, 25; 710/22, 2
See application file for complete search history.

(56) References Cited

U.S. PATENT DOCUMENTS

| | | | | |
|---|---|---|---|---|
| 6,051,030 A | * | 4/2000 | Beausoleil et al. | 703/28 |
| 6,134,516 A | * | 10/2000 | Wang et al. | 703/27 |
| 6,810,442 B1 | * | 10/2004 | Lin et al. | 710/22 |
| 6,842,728 B2 | * | 1/2005 | Gooding et al. | 703/23 |

OTHER PUBLICATIONS

Hauck, S. The Roles of FPGA's in Reprogrammable Systems, Proceedings of the IEEE, vol. 86, No. 4, Apr. 1998, pp. 615-638.*
Tavangarian, D. Flag-Oriented Parallel Associative Architectures and Applications, IEEE, Computer, vol. 27, No. 11, Nov. 1994, pp. 41-52.*
Nanda et al., A. MemorIES: A programmable, Real-Time Hardware Emulation Tool for Multiprocessor Server Design, ACM SIGPLAN Notices Nov. 2000, pp. 37-48.*
Dalrymple, S.H. A Parametric Associative Memory Emulation, ACM SIGMICRO Newsletter, Sep. 1975, pp. 10-36.*
Milovanovic et al., E.I. Matrix-Vector Multiplication on a Fixed-Size Linear Systolic Array, Computers & Mathematics with Applications, vol. 40, Iss. 10-11, Nov.-Dec. 2000, pp. 1189-1203.*

* cited by examiner

*Primary Examiner*—Russell Frejd
(74) *Attorney, Agent, or Firm*—James R. Nock

(57) ABSTRACT

A method, apparatus and program product are provided for increasing the usable memory capacity of a logic simulation hardware emulator. The present invention performs an additional logic synthesis operation during model build to transform an original logical array within a logic model into a transformed logical array, such that a row within the transformed logical array includes a plurality of merged logical array rows from the original logical array. The invention further modifies read and write port logic surrounding the transformed logical array during the logic synthesis operation to support read and write accesses during model emulation run time.

19 Claims, 10 Drawing Sheets

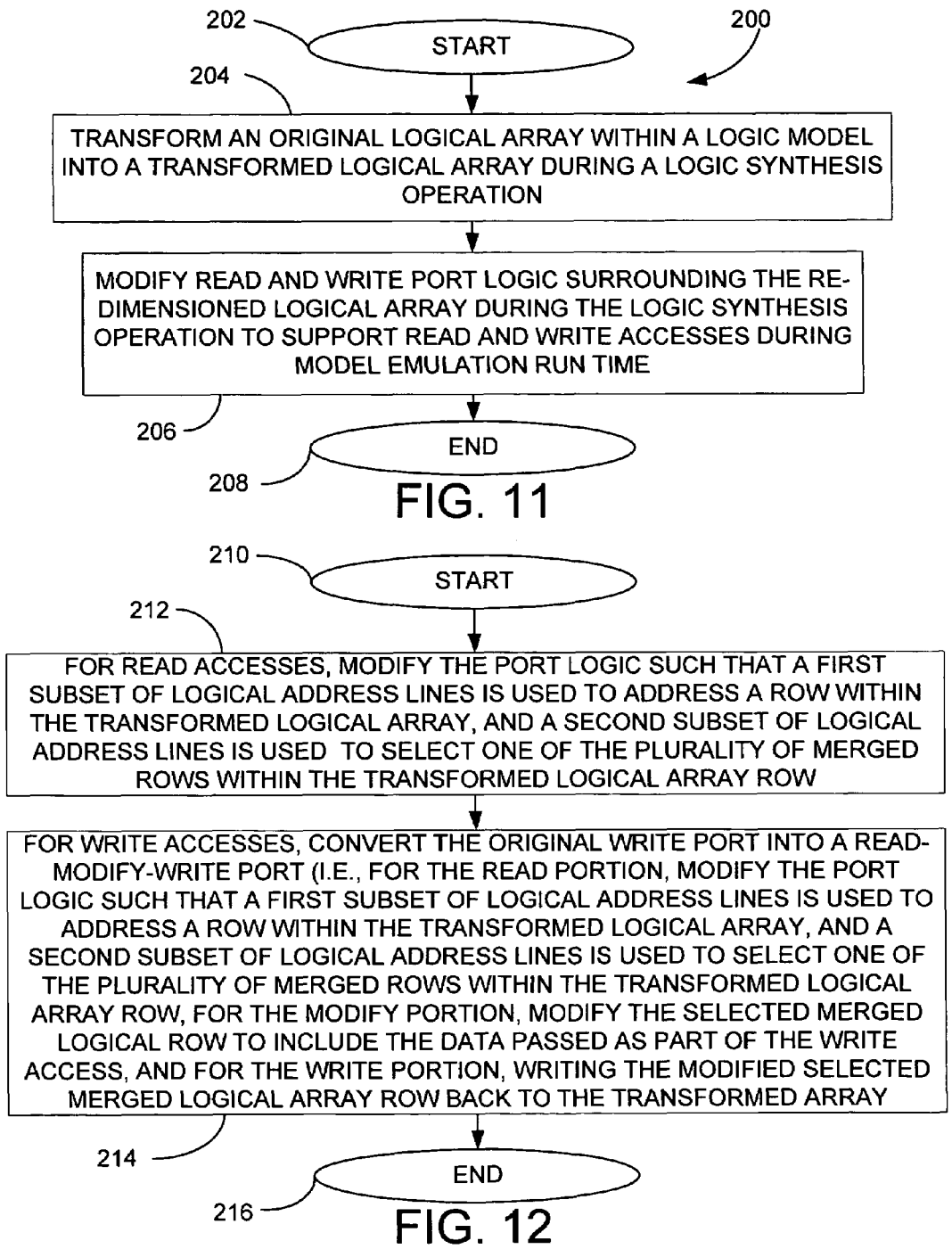

METHOD AND APPARATUS TO INCREASE THE USABLE MEMORY CAPACITY OF A LOGIC SIMULATION HARDWARE EMULATOR/ACCELERATOR

FIELD OF THE INVENTION

The present invention relates generally to logic simulation hardware emulation, and more specifically to the transforming of modeled memory elements to more efficiently utilize memory in a logic simulation hardware emulator/accelerator.

BACKGROUND OF THE INVENTION

Design verification is essential to virtually any very large scale integration (VLSI) design project. One of the popular verification methods is logic simulation. Logic simulation software reports on how a circuit under design responds to a sequence of input vectors, so the designer can judge whether the circuit behaves as expected over an input sequence. The more vectors simulated, the greater confidence the designer has in the correctness of the designing circuit.

As circuit complexity increases and the time to market shortens, inadequate simulation speed becomes a major bottleneck in the design process. As a result, several special purpose machines have been built to simulate/emulate complex logic designs in hardware, rather than software. Such emulation/acceleration devices can provide several orders of magnitude of speed improvement during the simulation/emulation process. Thus, the necessity and usefulness of such devices has increased enormously with growth in the complexity of integrated circuits.

An emulation/acceleration engine operates to mimic the logical design of a set of one or more integrated circuit chips. The emulation of these chips in terms of their logical design is highly desirable for several reasons which are discussed in more detail below. It is, however, noted that the utilization of emulation/acceleration engines has also grown up with and around the corresponding utilization of design automation tools for the construction and design of integrated circuit chip devices. In particular, as part of the input for the design automation process, logic descriptions of the desired circuit chip functions are provided. The existence of such software tools for processing these descriptions in the design process is well mated to the utilization of emulation/acceleration engines which are electrically configured to duplicate the same logic function that is provided in a design automation tool.

Utilization of emulation/acceleration devices permits testing and verification, via actual electrical circuits, of logical designs before these designs are committed to a so-called "silicon foundry" for manufacture. The input to such foundries is the functional logic description required for the chip, and its output is initially a set of photolithographic masks which are then used in the manufacture of the desired electrical circuit chip devices. However, it is noted that the construction of such masks and the initial production of circuit chips is expensive. Any passage of a given device having the prescribed logic functionality though such a foundry is an expensive and time consuming process which clearly should be undertaken only once. It is the purpose of emulation/acceleration engines to ensure such a single passage from the functional logic design stage through the stage of chip production via such a foundry.

Verifying that logic designs are correct before committing a design to manufacturing, therefore, eliminates the need for costly and time-consuming multiple passes through a silicon foundry. Debugging logic errors deep inside a logic chip can be extremely difficult because of very limited observability. Emulation provides two very significant advantages. Firstly, the proper verification of a functional logic design eliminates the need for a second costly passage through the foundry, and, secondly, and just as importantly, getting the design "right the first time" means that the design does not have to be corrected in the foundry. Accordingly, production delays are significantly reduced and the time to market for the particular technology/technology improvements embedded in the integrated circuit chip is greatly reduced, thus positively impacting the ability to deliver the most sophisticated technological solutions to consumers in as short of time as possible.

An additional advantage that emulation/acceleration systems have is that they act as a functioning system of electrical circuits which makes possible the early validation of software which is meant to operate the system that the emulator/accelerator is mimicking. Thus, software can be designed, evaluated and tested well before the time when the system is embodied in actual circuit chips. Additionally, emulation/acceleration systems can also operate as simulator-accelerator devices thus providing a high speed simulation platform.

FIG. 1A illustrates a high-level block diagram of a typical emulation/acceleration system 10 (hereinafter referred to as emulation system 10), which is controlled by a host workstation 12. Emulation system 10 includes at least one emulation board 14, which, in turn, contains a plurality of emulation modules 16, as shown in FIG. 1B. Each emulation module 16 contains a plurality of emulation processors 18, as shown in FIG. 1C. Each emulation processor 18 is programmed to evaluate a particular logic function (for example, AND, OR, XOR, NOT, NOR, NAND, etc.). The programmed emulation processors 18, together as a connected unit, emulate an entire desired logic design under test 11 (i.e., the programmed emulation processors form part of a simulation "model" 15 for the logic design). This simulation model 15 may also include some additional controllability/observability logic to aid in the simulation/emulation process.

The overall simulation throughput of such a system is controlled by the interface between the simulation model 15 running on the emulation system 10 and a runtime control program 20 running on a host workstation 12. Control program 20 interfaces with emulation board 14 via a control card 27. Control card 27 is further coupled to emulation board 14 via connector 19. Transactions between runtime control program 20 and the emulation board 14 include reading and writing the values of logic facilities contained within the simulation model and the execution of cycles to recalculate the model state by toggling the value of clock signals that propagate to latch facilities within simulation model 15.

Emulation system 10 typically contains logical designs having memory elements (e.g., arrays) of various sizes and dimensions. Emulation system 10 has a finite amount of physical memory resources where the logical arrays can reside during simulation. This physical memory is comprised of fixed-size components such as SRAM and SDRAM. One of the responsibilities of the software that compiles logical models for the emulator is to map (i.e., place or assign) the logical arrays within the logical design into the physical memory.

The physical memory resources of the emulation system 10 can be a limiting factor in the success of building a logic model, depending on the efficiency of mapping the logical arrays to the physical memories. Inefficiencies occur when the width of the logical array is not an even multiple of the width of the physical memory. As an example, if the width of the physical memory is 64 bits and the width of the logical array is only 24 bits, then there are 40 physical bits unused for every row in the logical array. Similar conditions occur when the logical array is wider than the physical memory. A 72-bit wide logical array will use up the entire width of the first 64-bit wide physical memory, but only use 8 of the 64 bits in a second physical memory. This represents a waste of 56 bits for every logical row. The greatest waste occurs when logical arrays are very narrow compared to the width of the physical memories. The general trend in memory technologies is to support new computing systems with ever widening data busses.

FIG. 2 shows a prior art method of partitioning and placing a logical array into multiple physical memories. If the width of an original logical array 42 is half the width of a physical memory 45, half of the physical memory is wasted or unused, as shown at shaded area 46.

There is a need for a method, apparatus and computer product to efficiently utilize previously inaccessible memory in an emulation system. Such a feature would enable models with large and diverse memory requirements to be successfully compiled that would have previously failed due to insufficient accessible physical memory.

SUMMARY OF THE INVENTION

The present invention provides a method, apparatus and computer readable program product for transforming modeled memory elements within a logic simulation hardware emulator/accelerator to more efficiently utilize physical memory.

In one embodiment of the present invention, a method and computer-readable program is provided for increasing the usable memory capacity of a logic simulation hardware emulator. The method begins by transforming an original logical array within a logic model into a transformed logical array during a logic synthesis operation. A row within the transformed logical array includes a plurality of merged rows from the original logical array. Next, read and write port logic surrounding the transformed logical array is modified to support read and write accesses during model emulation run time, thus making the transformed logical array functionally equivalent to the original logical array.

For read accesses, port logic surrounding the transformed logical array is modified such that during model emulation run time, a first subset of logical address lines is used to address a row within the transformed logical array, and a second subset of logical address lines is used to select one of the plurality of merged rows within the transformed logical array row.

For write accesses, port logic surrounding the transformed array is modified such that the original write port is converted into a read-modify-write port. For the read portion of the read-modify-write port, the port logic surrounding the transformed array is modified such that during model emulation run time, a first subset of logical address lines is used to address a row within the transformed logical array, and a second subset of logical address lines is used to select one of the plurality of merged rows within the transformed logical array row. For the modify portion of the read-modify-write port, the port logic surrounding the transformed array is modified such that during model emulation run time, the selected merged logical array row within the transformed logical array row is modified to include the data passed as part of the write access. For the write portion of the read-modify-write port, the port logic surrounding the transformed array is modified such that during model emulation run time, the modified selected merged logical array row is written back to the transformed logical array.

The present invention further provides an apparatus for synthesizing an original logical array within a logic model into a transformed logical array within a logic simulation hardware emulator. The logic synthesizer includes a transformer for transforming the original logical array such that a row within the transformed logical array contains a plurality of merged logical array rows from the original logical array. The logic synthesizer also includes a port logic modifier for modifying the port logic surrounding the transformed logical array to support read and write accesses during model emulation run time. The logic synthesizer further includes a symbol table generator for generating a symbol table used by a runtime controller during model emulation run time to properly access the physical memory that contains the transformed logical array.

In one embodiment, the set of port logic comprises read port logic and write port logic. The read port logic includes a plurality of logical address lines, the plurality of logical address lines comprising a first subset of lines used to address a row within the transformed logical array, and a second subset of logical address lines used to select one of the plurality of merged array rows within the transformed logical array row.

In one embodiment of the present invention, the write port includes logic to convert the original write port into a read-modify-write port. The read-modify-write port includes a new read port having a plurality of logical address lines, including a first subset of lines used to address a row within the transformed logical array and a second subset of lines used to select one of the plurality of merged rows within the transformed logical array row. The read-modify-write port logic further includes modify logic to modify the value of the selected merged logical array row, and write logic to write the modified selected logical array row back to the transformed logical array.

The foregoing and other features and advantages of the invention will be ent from the following more particular description of preferred embodiments of the ion, as illustrated in the accompanying drawings.

BRIEF DESCRIPTION OF THE DRAWINGS

FIG. 11 is a flow diagram illustrating a method for increasing the usable memory capacity of a logic simulation hardware emulator in accordance with the present invention.

FIG. 12 is a more detailed flow diagram of the modify read and write port logic step of the method illustrated in FIG. 11.

DETAILED DESCRIPTION OF THE PREFERRED EMBODIMENTS

The present invention provides a method, apparatus and program product which effectively increases the usable memory capacity of a logic simulation hardware emulator without adding physical memory. The solution is comprised of additional logic synthesis algorithms being run during model build to transform logical arrays for a better fit into physical memory dimensions, plus additional software routines executed at runtime to automatically resolve the new array organization and transparently provide read and write access to logical array data from simulation software.

Figure 1A:
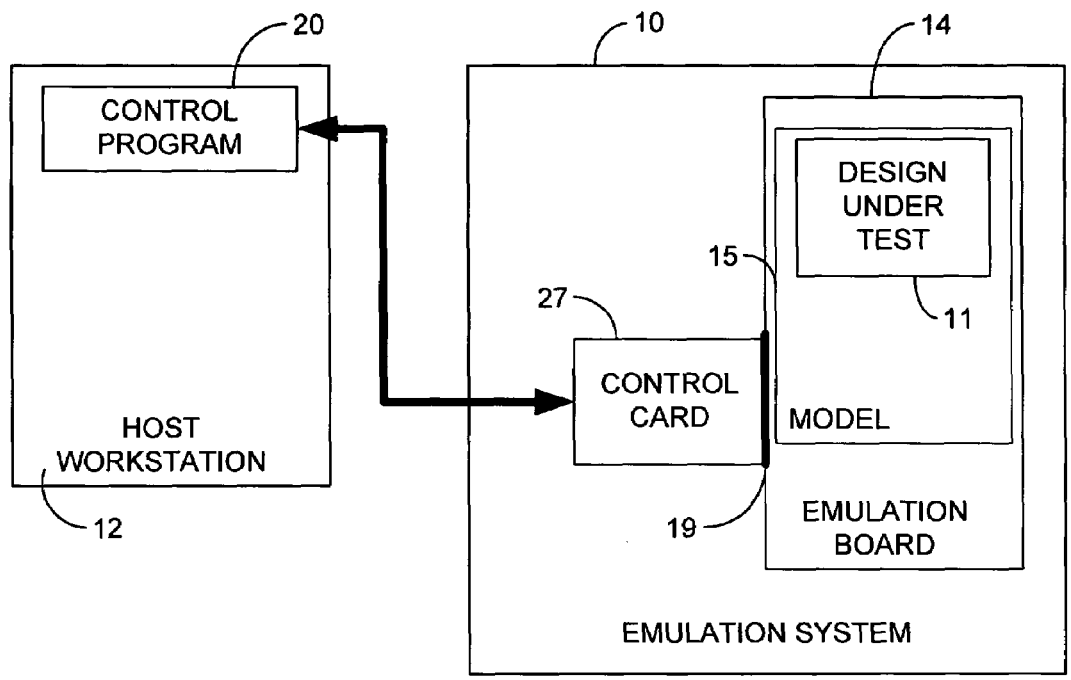
FIG. 1A (Prior Art) is a high-level block diagram of a typical logic emulation system controlled by a host workstation.
Figure 1B:
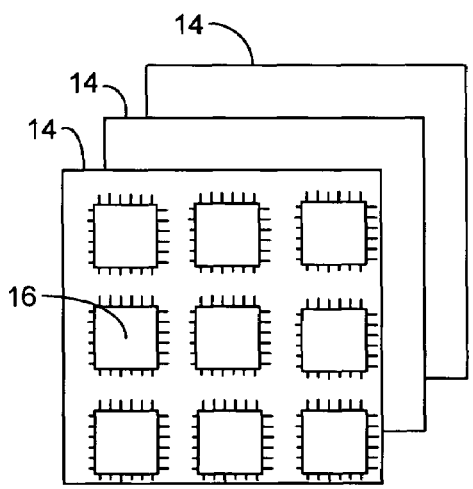
FIG. 1B (Prior Art) is a representation of an emulation board from the logic emulation system of FIG. 1A where the emulation board contains a plurality of emulation modules.
Figure 1C:
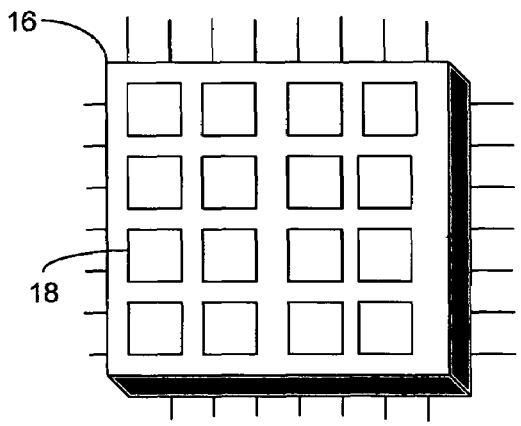
FIG. 1C (Prior Art) is a close-up view of an emulation module, previously illustrated in FIG. 1B, wherein the emulation module contains a plurality of emulation processors.
Figure 2:
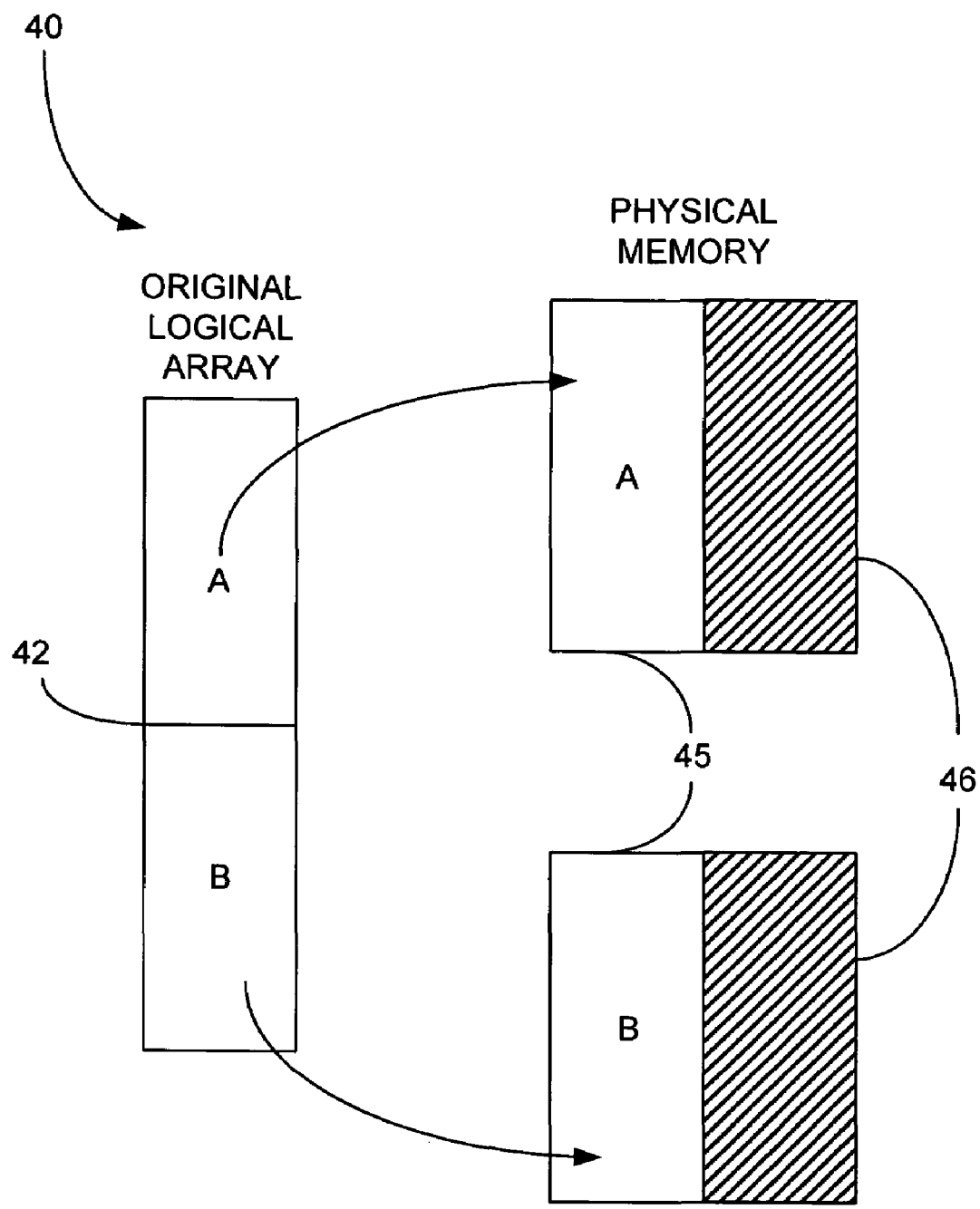
FIG. 2 (Prior Art) illustrates a prior art method of partitioning and placing an original logical array into multiple physical memories.
Figure 3:
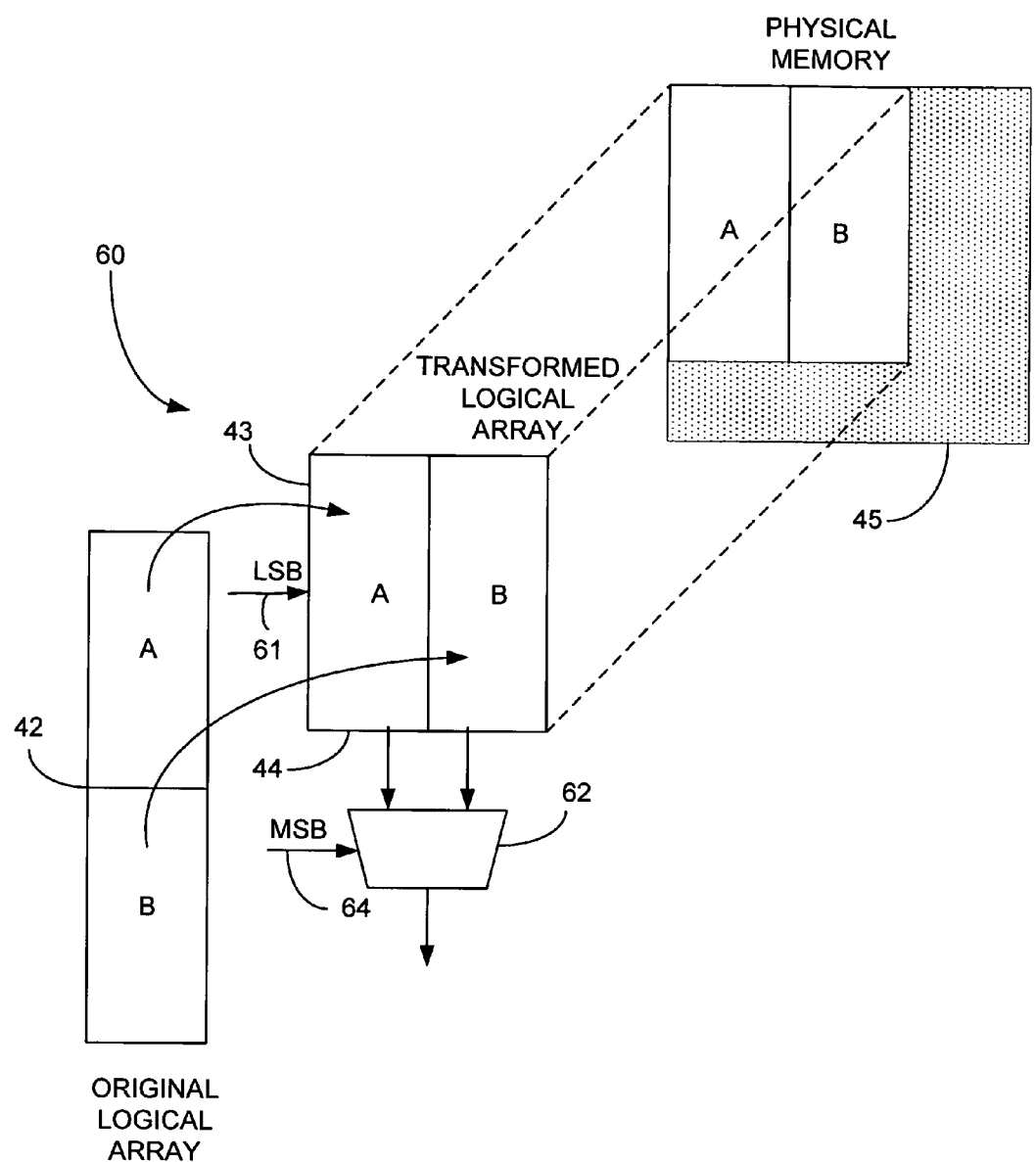
FIG. 3 illustrates how the same original logical array as shown in FIG. 2 can be transformed into a transformed logical array, which, in turn, is then assigned to a physical memory, thus effectively doubling the physical memory capacity of the emulation system.

Turning to the Drawings, wherein like numbers denote like parts throughout the several views, FIG. 3 illustrates how the same original logical array as shown in prior art FIG. 2 can be transformed into a new, transformed array which, when mapped to a physical memory, will utilize half of the previously consumed physical memory space, thus effectively doubling the memory capacity of the emulation system. To accomplish this, the original logical array 42 needs to be re-organized (i.e., transformed) by a synthesis algorithm run during model build.

In the illustrated example of FIG. 3, a logical array 42 with R rows and C columns is transformed to a new, transformed array 44 having R/2 rows and C×2 columns. A row 43 in the transformed array 44 now contains two merged logical array rows (shown as A and B). When the logic model is loaded into the emulation hardware, a row in the physical memory 45 will contain an entire row of the transformed logical array 44. To maintain the functionality of the original array, the port logic surrounding the transformed array 44 is modified such that a first subset of logical address lines (e.g., least significant logical address bit(s)) 61 is used to address a row 43 within transformed array 44, and the remaining logical address lines (e.g., a second subset of logical address lines) are used to select the merged logical array row within the row 43 of the transformed array 44. In the context of the present invention, the term "lines" includes, but is not limited to, "wires", "signals" and/or "nets". In the illustrated example, the most significant logical address bit (MSB) 64 is used to select the merged logical array row from either the upper-half (A) or the lower-half (B) of the transformed logical array row 43 via a multiplexer 62.

Figure 4:
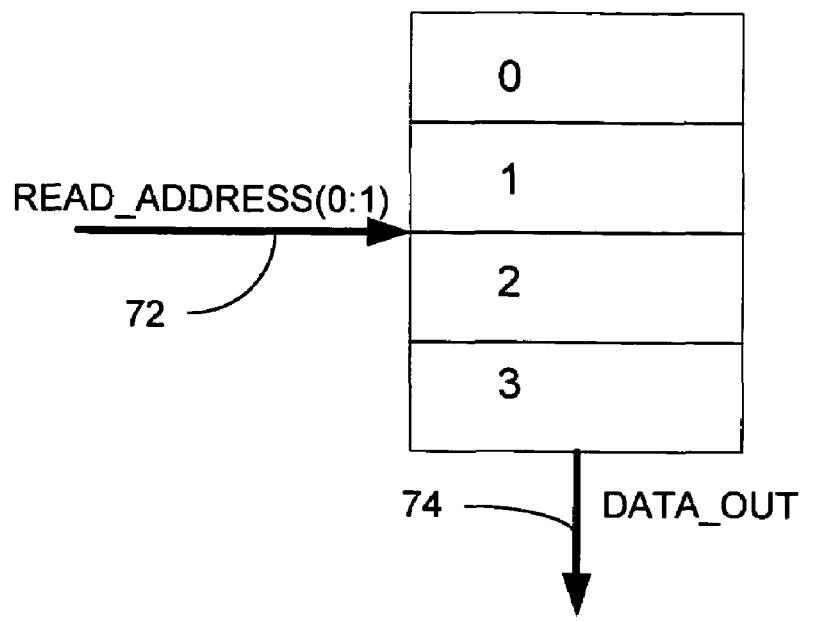
FIG. 4 illustrates signals associated with read port logic for accessing memory within the emulation system in accordance with the present invention.
Figure 5:
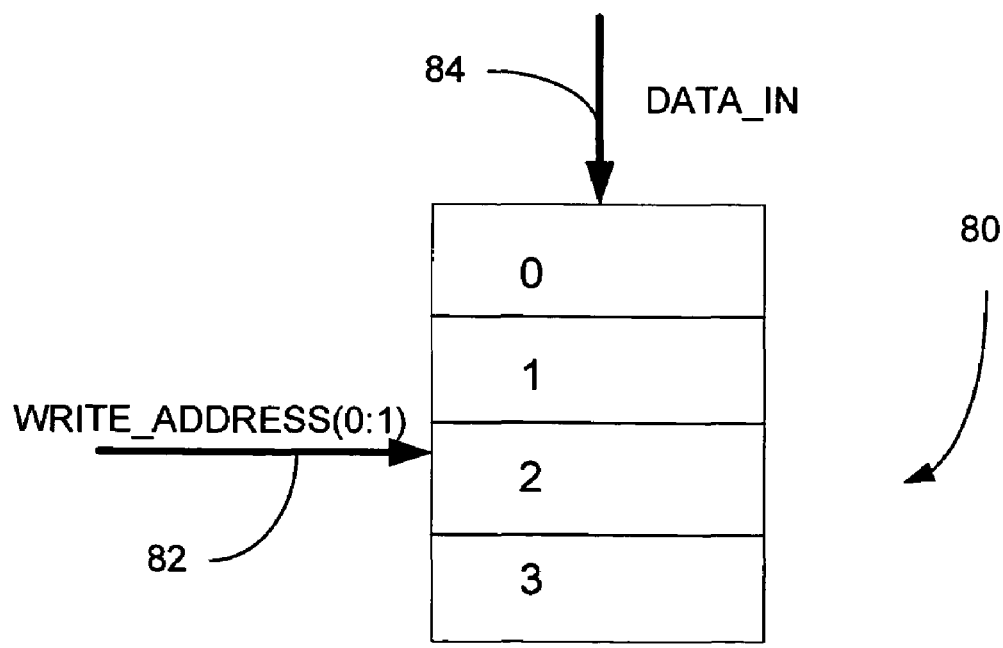
FIG. 5 illustrates signals associated with write port logic for accessing memory within the emulation system in accordance with the present invention.

In a logic model, array data is accessed via port logic surrounding the memory elements. FIGS. 4 and 5 illustrate the signals associated with read port logic and write port logic. A read port 70 comprises a ReadAddress 72 that selects a row within an array. The data contained within the selected array row is propagated to the DataOut signals 74. A write port 80 comprises a WriteAddress 82 that also selects a row within an array. The data contained within the selected array row is replaced by the value delivered by the DataIn signals 84.

Figure 6:
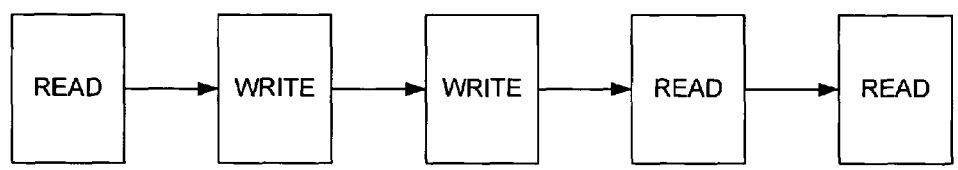
FIG. 6 illustrates a daisy chain of port primitive models used to specify the port evaluation sequence for each logical array within the emulation system in accordance with the present invention.
Figure 7:
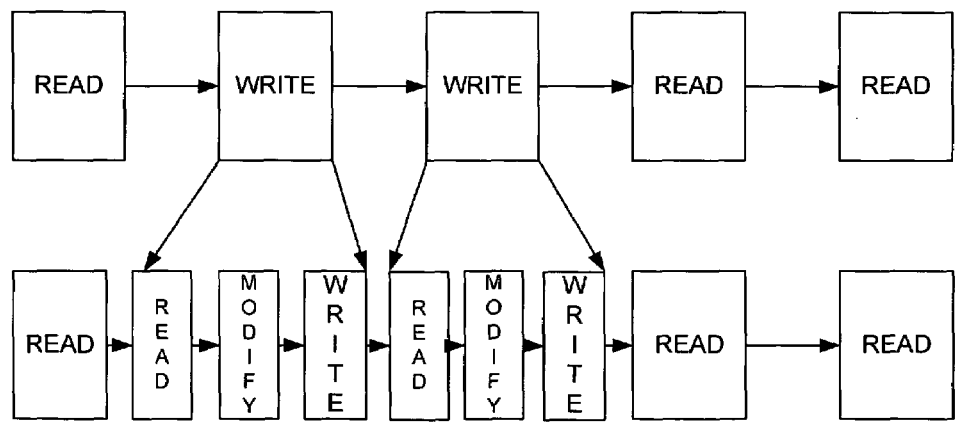
FIG. 7 illustrates a modified daisy chain of port primitive models used to specify the port evaluation sequence for each logical array within the emulation system in accordance with the present invention.

There can be multiple read and write ports for each array in the model. Even within the context of a cycle-accurate simulation, all the ports on an array are given a relative priority of evaluation. Array models can be defined as write-before-read, read-before-write, or even have an intermixed order of read and write ports. The sequence of port evaluation for each logical array can be modeled as a daisy-chain of port primitive models, as shown in FIG. 6. The illustrated daisy-chain does not represent any explicit dependencies between ports, but is just a mechanism of specifying the required order of execution to the model build scheduling routines. FIG. 7 represents a modified sequence of port primitive models in accordance with the present invention. In the illustrated example, the write port primitive models are replaced with a read-modify-write port primitive model. This is required within the context of the present invention since only a subset of the row within the transformed logical array is to be modified via the write operation. This is explained in greater detail in the subsequent discussion of FIG. 9.

Figure 8:
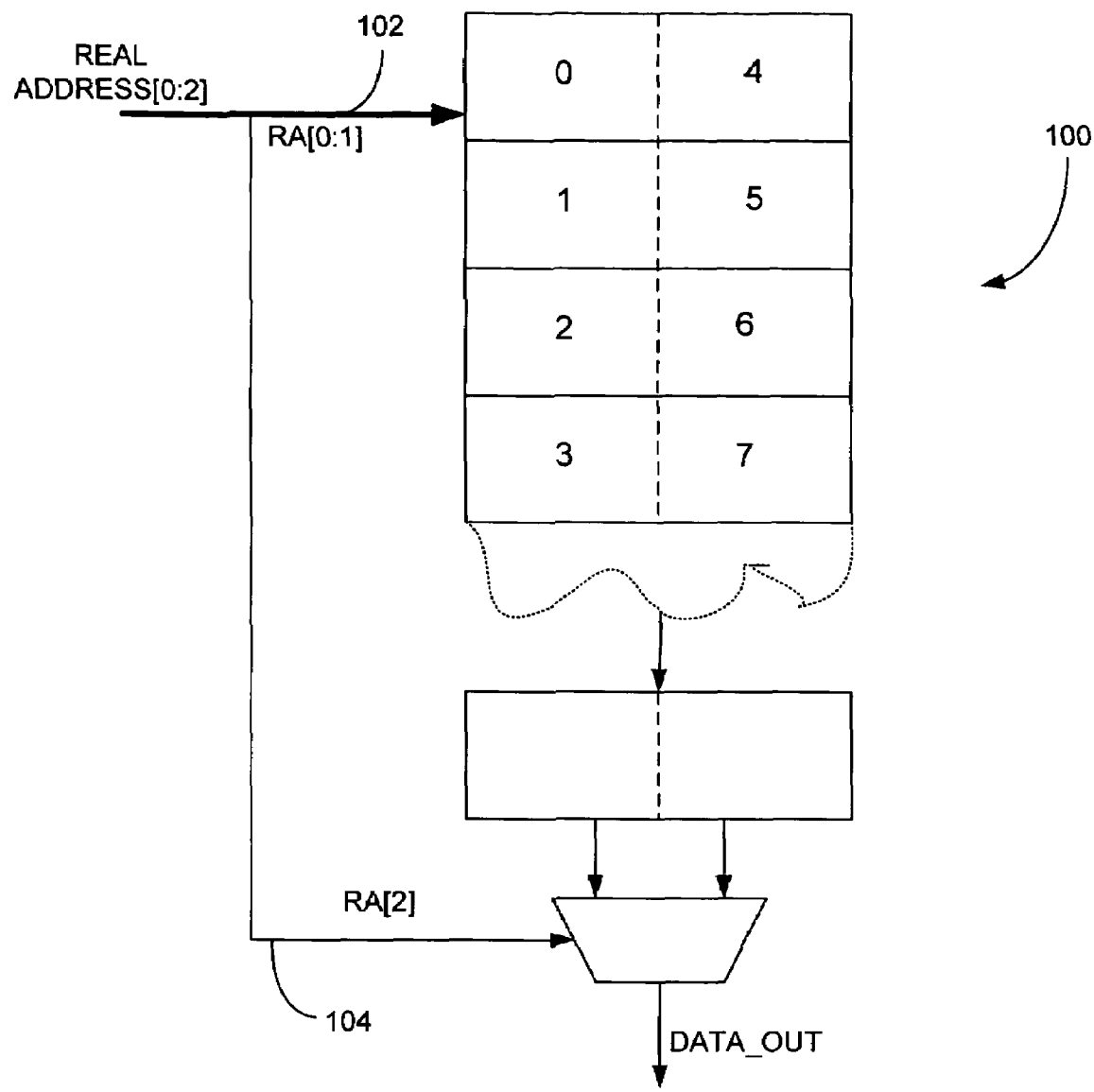
FIG. 8 illustrates a read port of a transformed logical array in accordance with the present invention.

FIG. 8 illustrates a read port of a transformed logical array in accordance with the present invention, shown generally at 100. In the illustrated embodiment, one or more of the least significant bits (LSB's) 102 of the ReadAddress are used to address a row within the transformed logical array (e.g., RA[0:1]). The remaining strands of the ReadAddress (i.e., the most significant bits (MSBs)) 104 are used to select a merged logical array row within the transformed logical array row (e.g., RA[2]). The number and arrangement of ReadAddress strands selected for each purpose may vary in different embodiments, yet still remain within the scope and spirit of the present invention. As an example, a more practical variation for array initialization or unload may be to use the least significant address bits to select the merged logical array row within the transformed logical array row.

Figure 9:
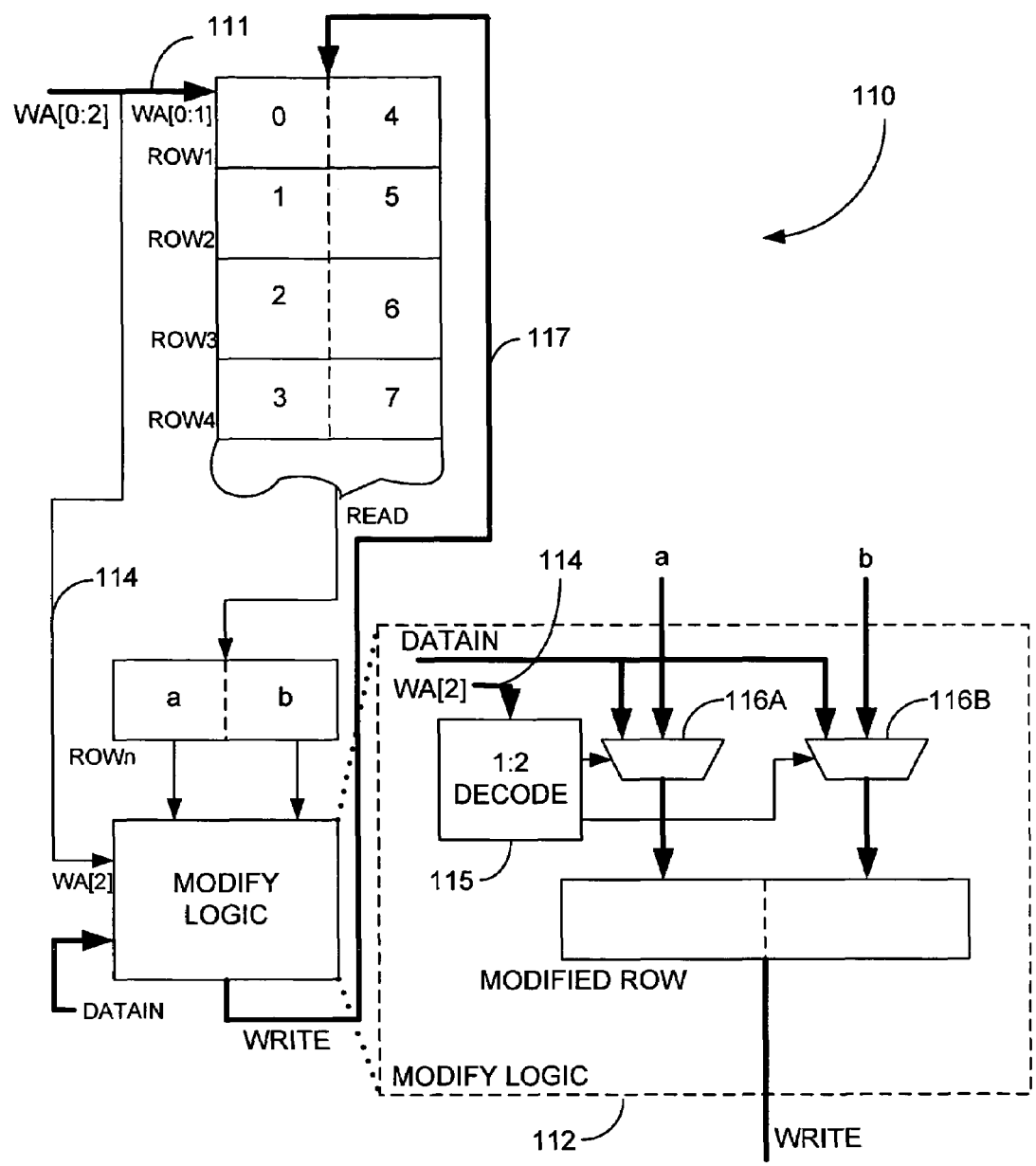
FIG. 9 illustrates a write port of a transformed logical array in accordance with the present invention.

FIG. 9 illustrates a write port of a transformed array in accordance with the present invention, shown generally at 110. As stated previously, transformed write ports become a bit more complex than transformed read ports, since only a subset of the transformed logical array row is to be modified. This is accomplished by converting the original write port into a "read-modify-write" port, as previously described in FIG. 7.

Similar to the read port, a first subset of the WriteAddress strands 111 (e.g., WA[0:1] selects a row within the transformed logical array to be read. A second subset of the WriteAddress strands 114 (e.g., WA[2]) is used to select which section of the transformed logical array row is to be replaced with the new data (DataIn). The entire transformed logical array row is reassembled with the modified logical row and written back to the transformed logical array, as shown at 117.

Expanded detail is shown for the modify logic at 112. The second subset of the WriteAddress strands 114 is decoded by a decoder 115 to activate only one of the selectors 116A, 116B that choose between the current contents of the transformed logical array row, or the new data values for the logical row (DataIn). The extra read port inserted for each of the new "read-modify-write" operations is also inserted in the corresponding spot in the port daisy chain as shown in FIG. 7.

In the illustrated examples, the amount of consumed memory has been reduced by one-half. A greater than two times increase in effective capacity can be obtained if the original logical array widths are significantly less than the corresponding width of the physical memories. The present invention contemplates easy scalability to handle varying ratios between the original logical array width and the physical memory width.

Figure 10:
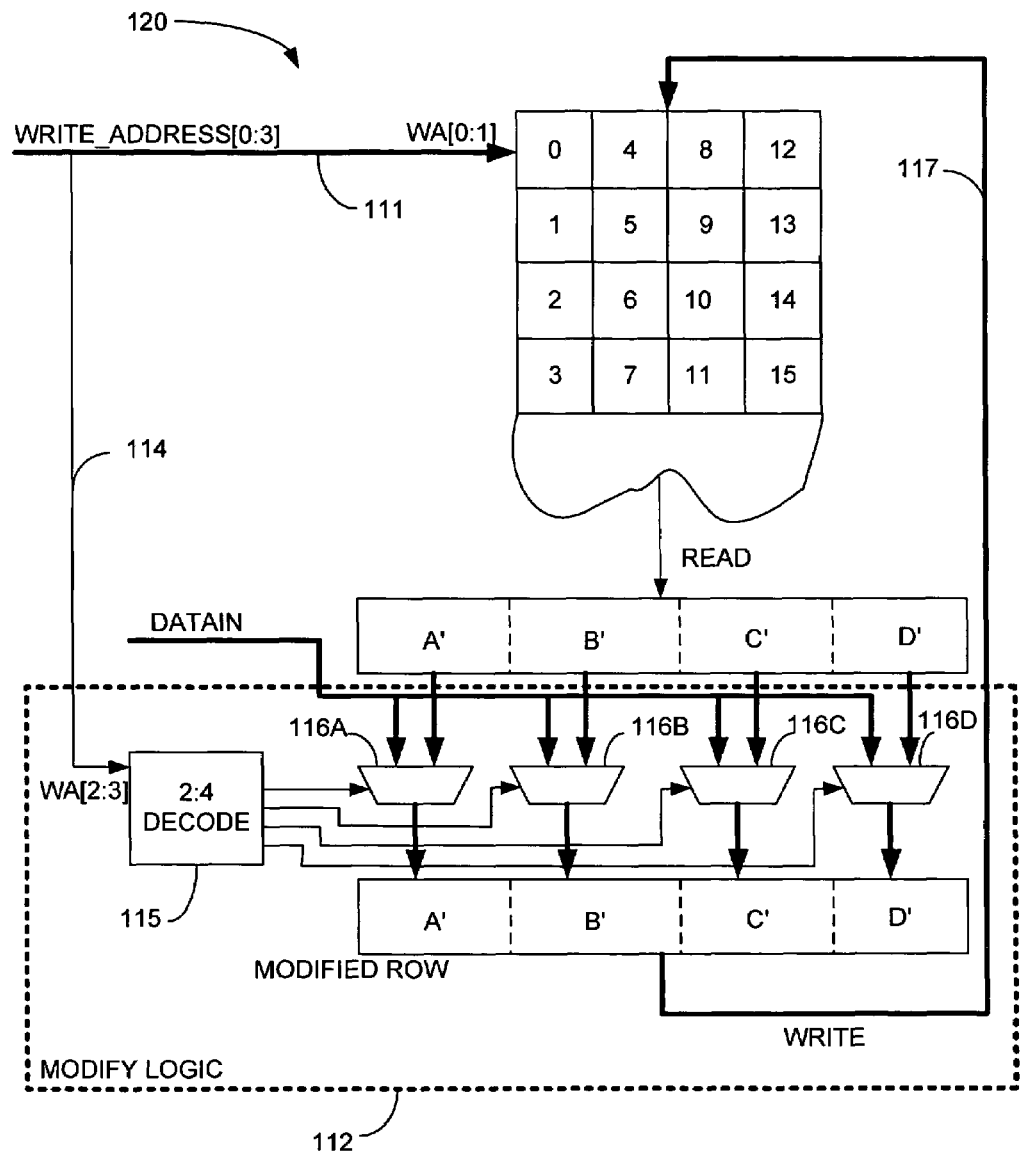
FIG. 10 illustrates an implementation of a single write port for a 4-way split of an original logical array in accordance with the present invention.

FIG. 10 illustrates the implementation of a single write port for a 4-way split of a logical array, shown generally at 120. In this example, the address decode function is expanded and selectors 116A, 116B, 116C, 116D are inserted for each merged logical array row within the transformed logical array row. The aggregate capacity increase is dependent on the variety of logical array widths within each model.

FIG. 11 is a flow diagram illustrating a method for increasing the usable memory capacity of a logic simulation hardware emulator, shown generally at 200. The method begins at block 202. At block 204, the method performs the step of transforming a logical array within a logic model into a transformed logical array during a logic synthesis operation (e.g., routine, program), such that a row within the transformed logical array comprises a plurality of merged rows from the logical array. At block 206, the method modifies read and write port logic surrounding the transformed logical array during the logic synthesis operation to support read and write accesses during model emulation run time. The method ends at block 208.

FIG. 12 is a more detailed flow diagram of the modify read and write port logic step 206 of the method previously illustrated in FIG. 11. The method begins at step 210. At block 212, the port logic is modified for read accesses such that a first subset of logical address lines is used to address a row within the transformed logical array, and a second subset of logical address lines is used to select one of the plurality of merged rows within the transformed logical array row. At block 214, the write port is converted into a read-modify-write port for write accesses. For the read portion of the read-modify-write port, the port logic surrounding the transformed array is modified such that during model emulation run time, a first subset of the logical address lines is used to address a row within the transformed logical array, and a second subset of logical address lines is used to select one of the plurality of merged rows within the transformed logical array row. For the modify portion of the read-modify-write port, the port logic surrounding the transformed logical array is modified such that during model emulation run time, the selected merged logical array row within the transformed logical array row is modified to include the data passed as part of the write access. Finally, for the write portion of the read-modify-write port, the port logic surrounding the transformed array is modified such that during model emulation run time, the modified selected merged logical array row is written back to the transformed logical array.

Figure 13:
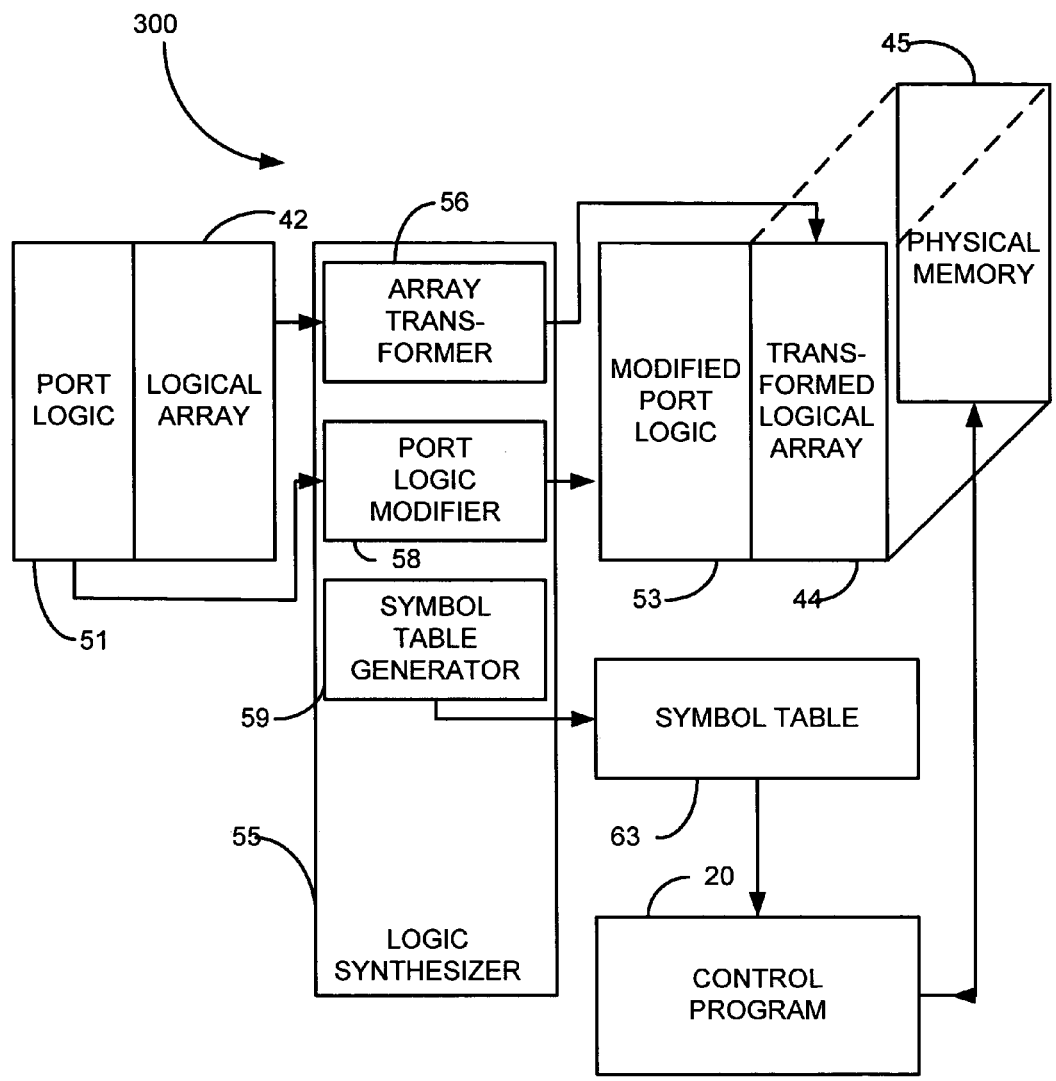
FIG. 13 is a block diagram of an apparatus for synthesizing a logical array within a logic model into a transformed logical array within a logic simulation hardware emulator, in accordance with the present invention.

FIG. 13 is a block diagram of an apparatus for synthesizing a logical array 42 within a logic model into a transformed logical array 44, shown generally at 300. Logical array 42 is transformed by a logic synthesizer 55 into transformed logical array 44. When the logic model is loaded into the emulation hardware, a row in the physical memory 45 will contain an entire row of the transformed logical array 44. In varying embodiments, logic synthesizer 55 is a computer program, routine and/or subprogram. An array transformer 56 within the logic synthesizer 55 transforms the logical array 42 such that a row within the transformed logical array 44 contains a plurality of merged logical array rows from the logical array. In varying embodiments of the present invention, array transformer 56 is an algorithm, routine and/or subprogram. A set of port logic 51 surrounds the original logical array 42. A port logic modifier 58 routine/subprogram within the logic synthesizer 55 modifies the port logic 51 surrounding the original logical array 42 into a modified port logic 53 surrounding the transformed logical array 44 to support read and write accesses during model emulation run time. The logic synthesizer 55 also includes a symbol table generator 59 routine/subprogram for generating a symbol table 63 used by control program 20 during model emulation run time to properly address the physical memory containing the transformed logical array 44.

The cost of using the present invention is in the addition of port logic, plus the additional delay of scheduling the new read ports. In general, these costs are negligible and are a reasonable trade-off for the increased memory capacity provided by the present invention. If certain arrays are problematic by being excessively complex or are contained within a critical path, the present invention provides the capability of restricting the transformation to only those arrays that produce the greatest memory saving benefit.

At this point, it is important to note that while the present invention has been and will continue to be described in the context of a fully functional hardware emulator (i.e., computer system), those skilled in the art will appreciate that the present invention is capable of being distributed as a program product in a variety of forms, and that the present invention applies equally regardless of the particular type of computer readable signal bearing media used to actually carry out the distribution. Examples of suitable signal bearing media include: recordable type media such as floppy drives and CD RW, and transmission type media such as digital and analog communications links.

The invention in its broader aspects is therefore not limited to the specific details, representative apparatus and method, and illustrative examples shown and described. Accordingly, departures may be made from such details without departing from the spirit or scope of applicants' general inventive concept. It is intended that the scope of the present invention be limited not by this detailed description, but rather by the claims appended hereto. Therefore, the invention lies in the claims hereinafter appended.

What is claimed is:

1. A method for increasing the usable memory capacity of a logic simulation hardware emulator during an emulation run, the method comprising the steps of:

transforming an original logical array within a logic model into a transformed logical array during a logic synthesis operation, wherein a row within the transformed logical array comprises a plurality of merged rows from the original logical array;

modifying read and write port logic surrounding the transformed logical array during the logic synthesis operation to support read and write accesses during model emulation run time;

loading the logic model and the modified read and write port logic into a physical memory of an emulation system residing within the logic simulation hardware emulator;

executing an emulation run on the emulation system, wherein a host workstation reads from and writes to the transformed logical array within the emulation system via the modified read and write port logic, the emulation run producing a recalculated model state result; and providing the recalculated model state result from the emulation system to the host workstation.

2. The method of claim 1, wherein the step of modifying read and write port logic surrounding the transformed logical array during model build to support read and write accesses during model emulation run time further comprises the step of: for read accesses, modifying port logic surrounding the transformed logical array such that during model emulation run time, a first subset of logical address lines is used to address a row within the transformed logical array, and a second subset of logical address lines is used to select one of the plurality of merged rows within the transformed logical array row.

3. The method of claim 1, wherein the step of modifying read and write port logic surrounding the transformed logical array during model build to support read and write accesses during model emulation run time further comprises the step of:

for write accesses, modifying port logic surrounding the transformed logical array such that the original write port is converted into a read-modify-write port.

4. The method of claim 3, wherein the step of modifying port logic surrounding the transformed logical array such that the original write port is converted into a read-modify-write port comprises the steps of:

for the read portion of the read-modify-write port, modifying port logic surrounding the transformed logical array such that during model emulation run time a first subset of logical address lines is used address a row within the transformed logical array, and a second subset of logical address lines is used to select one of the plurality of merged rows within the transformed logical array row;

for the modify portion of the read-modify-write port, modifying port logic surrounding the transformed logical array such that during model emulation run time, the selected merged logical array row within the transformed logical array row is modified to include the data passed as part of the write access; and for the write portion of the read-modify-write port, modifying port logic surrounding the transformed logical array such that during model emulation run time, the modified selected merged logical array row is written back to the transformed logical array.

5. The method of claim 1, wherein the transforming of the original logical array is selectable, based on whether the original logical array is in a critical path in the logic model.

6. The method of claim 1, wherein the transforming of the original logical array is selectable, based on the complexity of the original logical array.

7. A computer-readable program stored on a recordable computer-readable medium, the computer readable program providing a method of increasing the usable memory capacity of a logic simulation hardware emulator during an emulation run, the computer-readable program comprising the steps of:

transforming an original logical array within a logic model into a transformed logical array during a logic synthesis operation, wherein a row within the transformed logical array comprises a plurality of merged rows from the original logical array;

modifying read and write port logic surrounding the transformed logical array during the logic synthesis operation to support read and write accesses during model emulation run time;

loading the logic model and the modified read and write port logic into a physical memory of an emulation system residing within the logic simulation hardware emulator;

executing an emulation run on the emulation system, wherein a host workstation reads from and writes to the transformed logic array within the emulation system via the modified read and write port logic, the emulation run producing a recalculated model state result; and providing the recalculated model state result from the emulation system to the host workstation.

8. The computer-readable program of claim 7, wherein the step of modifying read and write port logic surrounding the transformed logical array during model build to support read and write accesses during model emulation run time further comprises the step of:

for read accesses, modifying port logic surrounding the transformed logical array such that during model emulation run time, a first subset of logical address lines is used to address a row within the transformed logical array, and a second subset of logical address lines is used to select one of the plurality of merged rows within the transformed logical array row.

9. The computer-readable program of claim 7, wherein the step of modifying read and write port logic surrounding the transformed logical array during model build to support read and write accesses during model emulation run time further comprises the step of:

for write accesses, modifying port logic surrounding the transformed array such that the original write port is converted into a read-modify-write port.

10. The computer-readable program of claim 9, wherein the step of modifying port logic surrounding the transformed logic array such that the original write port is converted into a read-modify-write port comprises the steps of:

for the read portion of the read-modify-write port, modifying port logic surrounding the transformed logical array such that during model emulation run time a first subset of logical address lines is used to address a row within the transformed logical array, and a second subset of logical address lines is used to select one of the plurality of merged rows within the transformed logical array row;

for the modify portion of the read-modify-write port, modifying port logic surrounding the transformed logical array such that during model emulation run time, the selected merged logical array row within the transformed logical array row is modified to include the data passed as part of the write access; and for the write portion of the read-modify-write port, modifying port logic surrounding the transformed logical array such that during model emulation run time, the modified selected merged logical array row is written back to the transformed logical array.

11. The computer-readable program of claim 7, wherein the transforming of the original logical array is selectable, based on whether the original logical array is in a critical path in the logic model.

12. The computer-readable program of claim 7, wherein the transforming of the original logical array is selectable, based on the complexity of the original logical array.

13. An apparatus for increasing the usable memory capacity of a logic simulation emulator during an emulation run the apparatus comprising:
- a host workstation;
- an emulation system having a physical memory, the emulation system electronically coupled to the host workstation;
- a logic synthesizer for synthesizing the logic model, wherein the logic synthesizer further comprises:
  - an array transformer for transforming the original logical array such that a row within the transformed logical array contains a plurality of merged logical array rows from the original logical array;
  - a port logic modifier for modifying the port logic surrounding the transformed logical array to support read and write accesses during model emulation run time;
  - a symbol table generator for generating a symbol table used by a runtime controller during model emulation run time to properly address the transformed logical array; and
- a loader for loading the logic model into the physical memory of the emulation system;

wherein the host workstation controls the emulation run on the emulation system, the host workstation reading from and writing to the transformed logical array via the modified read and write port logic utilizing the symbol table; and wherein a recalculated model state result is generated via the emulation run, and is returned from the emulation system to the host workstation.

14. The apparatus of claim 13, wherein the set of port logic comprises read port logic and write port logic.

15. The apparatus of claim 14, wherein the read port logic includes a plurality of logic address lines, the plurality of logical address lines comprising a first subset of lines used to address a row within the transformed logical array, and a second subset of logical address lines used to select one of the plurality of merged array rows within the transformed logical array row.

16. The apparatus of claim 14, wherein the write port includes logic to convert the original write port into a read-modify-write port.

17. The apparatus of claim 16, wherein the read-modify-write port includes a new read port, wherein the new read port includes a plurality of logical address lines, the plurality of logic address lines comprising a first subset of lines used to address a row within the transformed logical array, and a second subset of logical address lines is used to select one of the plurality of merged rows within the transformed logical array row.

18. The apparatus of claim 16, wherein the read-modify-write port includes modify logic to modify the value of the selected merged logical array row.

19. The apparatus of claim 16, wherein the read-modify-write port includes write logic to write the modified merged logical array row back to the transformed logical array.

* * * * *